United States Patent [19]

Chatterjee

[11] Patent Number: 4,889,832
[45] Date of Patent: Dec. 26, 1989

[54] METHOD OF FABRICATING AN INTEGRATED CIRCUIT WITH METAL INTERCONNECTING LAYERS ABOVE AND BELOW ACTIVE CIRCUITRY

[75] Inventor: Pallab K. Chatterjee, Dallas, Tex.

[73] Assignee: Texas Instruments Incorporated, Dallas, Tex.

[21] Appl. No.: 137,546

[22] Filed: Dec. 23, 1987

[51] Int. Cl.⁴ ............................................ H01L 21/22
[52] U.S. Cl. .......................... 437/203; 437/90; 437/924; 437/974; 437/984; 156/662; 357/68
[58] Field of Search .................. 437/203, 65, 86, 90, 437/249, 974; 156/662; 357/68

[56] References Cited

U.S. PATENT DOCUMENTS

| | | | |
|---|---|---|---|
| 3,133,336 | 12/1959 | Marinace | 437/89 |
| 3,433,686 | 1/1966 | Marinace | 437/86 |
| 3,493,820 | 2/1970 | Rosvold | 437/65 |
| 3,787,252 | 1/1974 | Filippazzi et al. | 437/90 |
| 3,944,447 | 3/1976 | Magdo et al. | 437/974 |
| 4,169,000 | 9/1979 | Riseman | 437/86 |
| 4,784,970 | 11/1988 | Solomon | 437/90 |

Primary Examiner—Brian E. Hearn
Assistant Examiner—Beverly A. Pawlikowski
Attorney, Agent, or Firm—Douglas A. Sorensen; Rodney M. Anderson; Melvin Sharp

[57] ABSTRACT

A process for forming backside contacts includes first forming an etch stop layer (12) beneath the surface of a silicon substrate. An active circuit is then formed in the silicon surface and associated metal interconnecting layers formed on the upper surface of the substrate. A planarizing layer is then formed on the upper surface of the substrate which is operable to be connected to a mechanical support. Thereafter, the backside of the substrate is etched away up to the etch stop layer (12). The thickness of the remaining substrate between the metal layers on the upper surface and the etch stop layer is sufficiently thin that the alignment marks on the upper surface can be seen through the substrate. These alignment marks are utilized to form vias from the backside to the active elements and then deposit and pattern interconnecting layers on the backside.

16 Claims, 3 Drawing Sheets

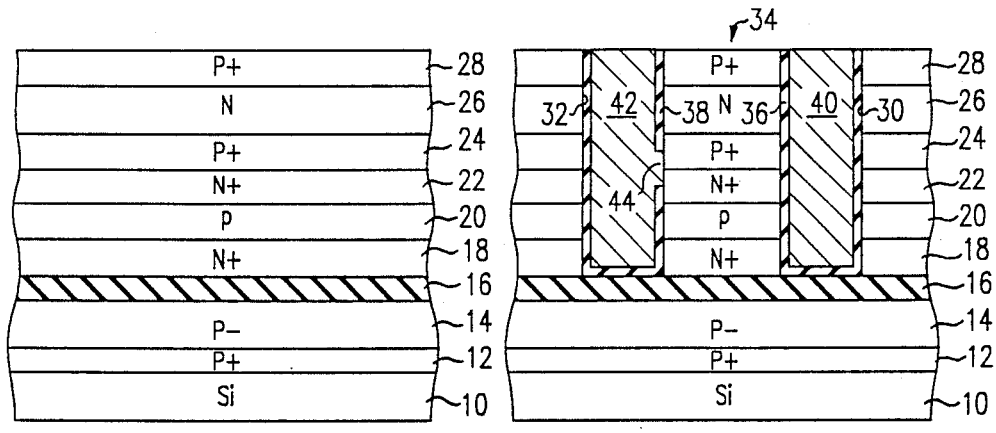
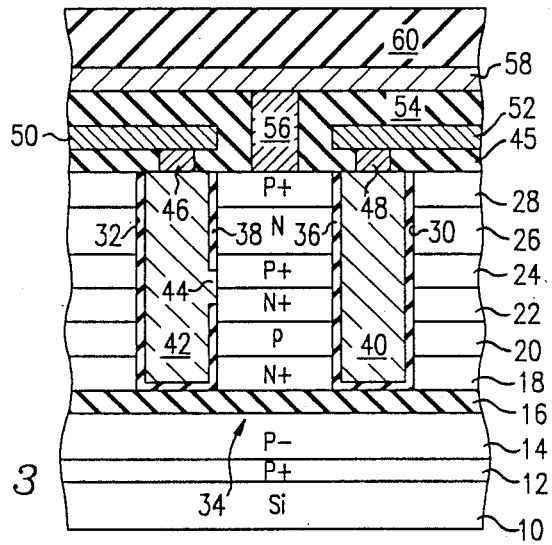
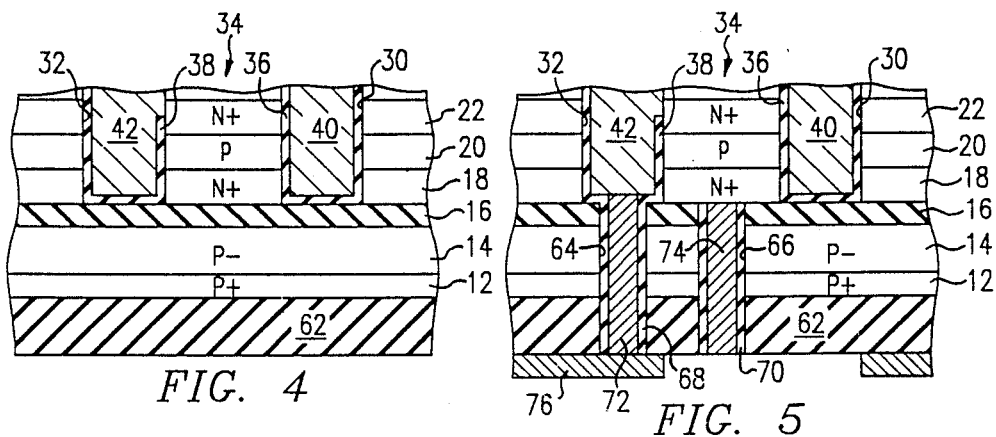

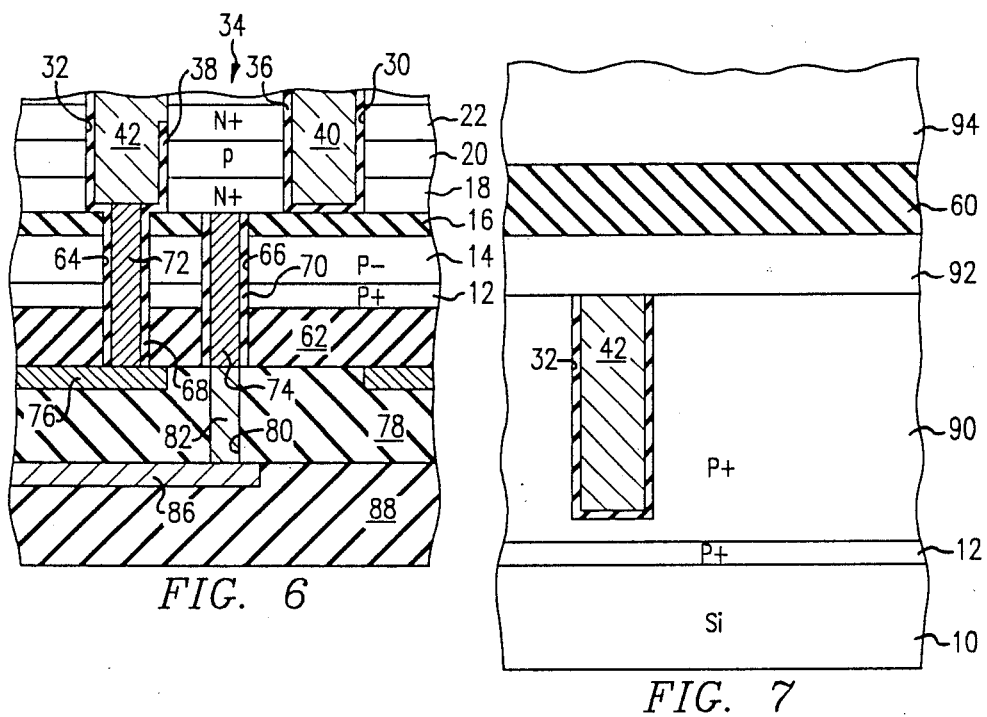
FIG. 6
FIG. 7
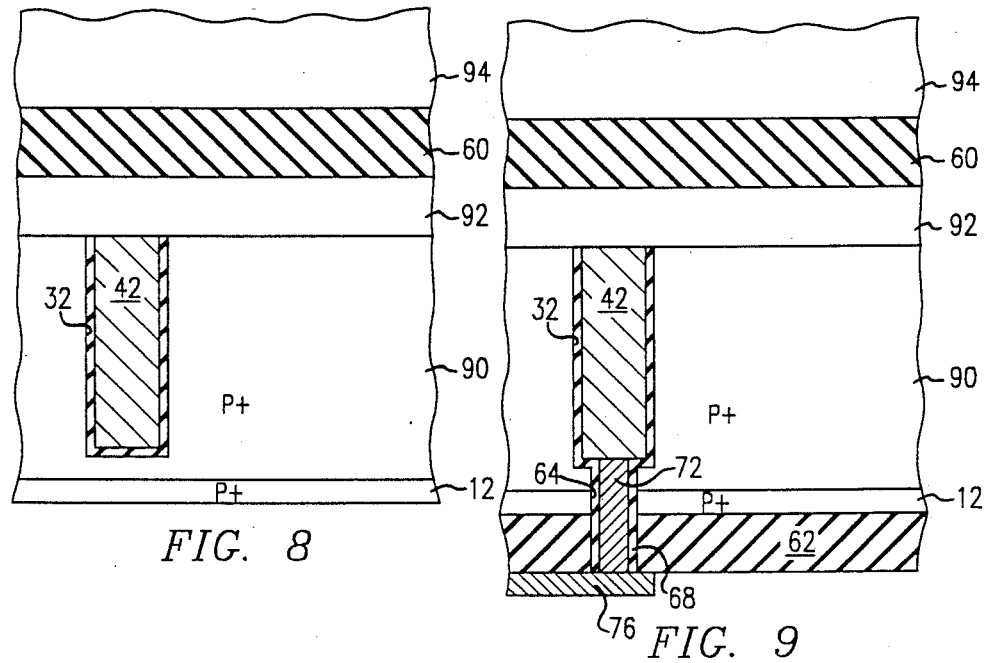
FIG. 8
FIG. 9

METHOD OF FABRICATING AN INTEGRATED CIRCUIT WITH METAL INTERCONNECTING LAYERS ABOVE AND BELOW ACTIVE CIRCUITRY

TECHNICAL FIELD OF THE INVENTION

The present invention pertains in general to integrated circuits, and more particularly to the use of interconnecting metal layers fabricated both above and below an active circuit in an integrated circuit structure.

BACKGROUND OF THE INVENTION

Conventional integrated circuit wiring utilizes a multilevel structure which is fabricated above the active devices formed on the semiconductor surface. Connections between active devices are achieved through several patterned conducting layers which are connected through vias to one another and to the underlying active circuitry. However, there are inherent process limitations to the number of successive levels of interconnects that can feasibly be implemented. This is due to the layout of the vias and contacts for the upper interconnecting levels which place substantial constraints on the lower interconnect levels and associated active devices.

Conventionally, an active device is first fabricated by defining the active circuitry in the surface of a silicon wafer. Thereafter, an insulating layer is disposed over the substrate and vias formed through the insulating layers to expose selected areas of the active circuitry. A metal interconnecting layer is then formed on the upper surface of the insulating layer with interconnections through the vias to the exposed areas of the active circuitry on the silicon surface. Thereafter, additional levels of insulating layers and metal layers can be disposed to accommodate complex interconnection schemes. The inherent limitations resulting from the layout of the active circuits and the metal interconnecting layers place certain constraints on the number of interconnecting levels that can be utilized. The layout of the active active devices on the semiconductor surface limits the number of successive interconnect levels and more often than not defines the layout constraints for the active circuits.

One solution to the interconnect problem has been to provide a buried interconnecting layer fabricated from a heavily doped region. These buried layers are fabricated in the process by forming a heavily doped region in the substrate and then growing an epitaxial layer over the heavily doped region. The circuit is then defined in the surface of the epitaxial layer and then contacts are made with this buried layer from the surface. However, the buried conductor technology utilizing heavily doped regions has its own inherent limitations.

In view of the above, there exists a need for a method to increase the number of levels of interconnects without unduly complicating the layout of the active devices on the semiconductor surface.

SUMMARY OF THE INVENTION

The present invention disclosed and claimed herein comprises a method for forming interconnecting lines on both sides of an integrated circuit. The method includes first forming an etch stop layer beneath the surface of a semiconductor layer and above the etch stop layer. A first layer of interconnect lines is then formed above the surface of the semiconductor layer and separated therefrom by an insulating layer of oxide. The first layer of interconnects contacts the active circuit elements through vias and then a planarizing layer is formed on the upper surface of the substrate. The planarizing layer is then fused with a mechanical support and the bottom surface of the substrate etched away up to the etch stop layer. A second layer of interlevel oxide is then formed on the below the semiconductor layer and vias etched through the interlevel oxide and the bottom of the semiconductor layer to expose selected areas on the bottom surface of the active elements. Sidewall oxide is then deposited on the sidewalls of the vias and conductive plugs are formed therein. A second layer of oxide and metal may be then deposited on the substrate to form a second interconnecting level on the bottom surface of the device.

In another embodiment of the present invention, the vias on the bottom surface of the substrate are patterned by viewing the pattern on the upper surface of the substrate through the substrate. Once patterned, the vias are then aligned precisely with the pattern on the upper surface and formed therefrom.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

FIG. 1 illustrates a cross-sectional diagram of a multilayer substrate utilizing the process of the present invention;

FIG. 2 illustrates a cross-sectional diagram of the multilevel substrate of FIG. 1 with a vertical transistor formed therein;

FIG. 3 illustrates a cross-sectional diagram of the device of FIG. 2 with two layers of metal interconnects formed on the surface thereof;

FIG. 4 illustrates a cross-sectional diagram of the device of FIG. 3 illustrating the structure formed on the bottom surface thereof;

FIG. 5 illustrates a a cross-sectional diagram of a first level of interconnect on the bottom surface of the substrate of FIG. 4;

FIG. 6 illustrates a cross-sectional diagram of the structure of FIG. 5 with a second level of metal interconnect formed on the bottom surface thereof;

FIG. 7 illustrates a cross-sectional view of a structure including the holding layer on the upper surface thereof after formation of the active circuit;

FIG. 8 illustrates a cross-sectional diagram of the structure of FIG. 7 wherein the bottom surface is etched back to the P+ etch stop layers;

FIG. 9 illustrates a cross-sectional diagram of the structure of FIG. 8 with the interconnect level formed on the bottom surface.

DETAILED DESCRIPTION OF THE INVENTION

Figure 10:
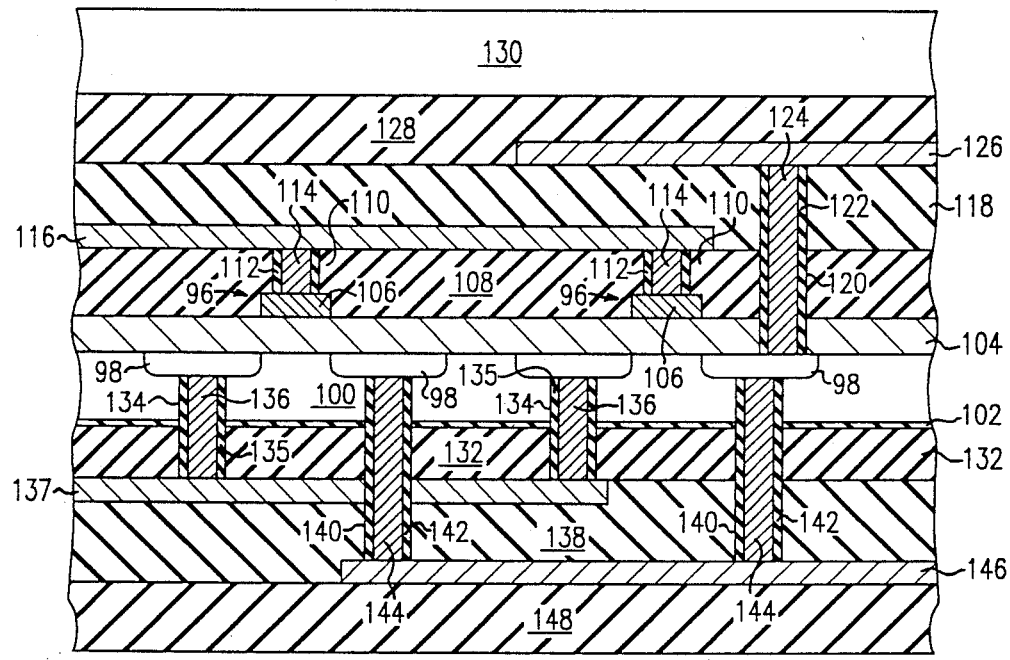
FIG. 10 illustrates a cross-sectional diagram of a diffused region CMOS having top and bottom interconnect levels.

Referring now to FIG. 1, there is illustrated a cross-sectional diagram of a multilayer substrate which is utilized to form an active structure thereon. The fabrication initiated with selection of a silicon substrate 10 which has a suitable doping level. As will be described hereinbelow, the silicon substrate 10 is merely utilized for holding. After selection of the silicon substrate 10, a P+ layer 12 is epitaxially grown on the surface of the silicon substrate 10. The P+ layer 12, as will be described hereinbelow, provides an etch stop layer used during the etching the silicon substrate 10 from the bottom surface thereof. This process is described in U.S. patent application Ser. No. 053,440, filed May 22, 1987 and entitled "Silicon-On-Insulator Integrated Circuits and Method" and assigned to the present assignee, which application is incorporated by reference herein.

After formation of the P+ layer 12, an epitaxial layer 14 of silicon material is deposited on the etch stop layer 12. The epitaxial layer 14 may be deposited insitu as a semiconductor material lightly doped with a P type impurity or deposited and doped thereafter by diffusion or ion implantation techniques. Layer 14 may be doped with a P type impurity such as boron.

Deposited on top of the P— layer 14 is an oxide layer 16 which can be deposited by decomposition of tetraethyloxysilane, referred to as the TEOS process. This deposition of oxide is typically performed at a temperature of around 700° C. The low temperature of deposition limits diffusion of the dopants from the P. layer 12.

After deposition of the oxide layer 16, an epitaxial layer 18 of silicon is deposited on the oxide layer 16. The epitaxial layer 18 is heavily doped with an N type impurity to form an N+ doping level, using an impurity such as phosphorous. After formation of the N+ layer, a plurality of alternating P and N type epitaxial layers are formed on the surface of the N+ layer 18 in a similar manner to the process utilized to form the N+ layer 18. A P type layer 20 is formed on top of the N+ layer 18, an N+ epitaxial layer 22 is formed on top of the P type layer 20, a P+ epitaxial layer 24 is formed on the N+ layer 22, an N type layer 26 is formed on the P+ layer 4 and a P+ layer 28 is formed on the N type layer 26. As will be described in more detail hereinbelow, the N+ layer 22 and N+ layer 18 are used to form the source and drains of an MOS transistor with the P type layer 20 forming the channel. In a similar manner, the P+ layers 28 and 24 form the source and drains of a P channel MOS transistor with the N type layer 26 forming the channel thereof. Since the N type layer 26 and the P type layer 20 form the channels of an MOS transistor, these layers can be appropriately doped to achieve a desired threshold of the transistor, depending upon the various design constraints. In addition, the depth of each of these layers corresponds to the desired channel length of the transistor which, depending upon the design parameters may be short or long. These two transistors are operable to be connected as a CMOS device to perform an inverter, as will be described in more detail hereinbelow.

For illustrative purposes, the following process steps will be illustrated with respect to the upper portion of the structure of FIG. 1 above the P— layer 14 and then described with respect to the removal of the silicon layer 10 and formation of active area on the bottom of the substrate beneath the P— layer 14. Referring now to FIG. 2, there is illustrated the next step in the process. Two trenches 30 and 32 are etched in the structure of FIG. 1 which define a transistor stack 34 of the alternating N and P layers 18-28. The trenches 30 and 32 are formed by subjecting the structure of FIG. 1 to an anisotropic etch on the upper surface thereof after patterning, the anisotropic etch utilizing a technique such as a plasma reactive ion etch (RIE), which removes semiconductor material in an opening in a downward direction. This etch is maintained for a sufficient amount of time to etch through the layers 18-28 to the oxide layer 16.

After the photoresist utilized for the patterning step is removed, a layer of silicon dioxide is formed over the substrate to provide a conformal coating by subjecting the wafer to a silicon oxidizing ambiant. The silicon oxide layer, as defined hereinbelow, forms the gate oxide of the two transistors, the P channel transistor and the N channel transistor. Further, it provides an insulating layer in the trench for forming a contact. Thus, the thickness of the silicon dioxide layer must be selected to be sufficiently thin to provide the proper operating characteristics for the transistors. The gate oxide layer is referred to by reference numeral 36 and the insulating layer for the connection to the source and drains of the two transistors, which contact forms the output of the CMOS inverter, is referred to by reference numeral 38.

During formation of the plug 42, a contact 44 is formed through the oxide layer 38 to the N+ and P+ layers 22 and 24 in the transistor stack 34. Briefly, the plug material is deposited in the via 32 up to the level of the contact 44. An etch is performed to remove the sidewall oxide 38 from the unplugged portion of the via 32. Additional plug material is added to fill the via 32 to the top of the contact 44. A sidewall oxidation is performed on the unplugged portion, which is subsequently filled with plug material. The process for forming the contact 44 is described in U.S. patent application Ser. No. 870,469, filed June 4, 1986 and entitled "Dram Cell and Array," which application is incorporated herein by reference.

After formation of the silicon oxide layer on the surfaces of the trenches 30 and 32, conductive plugs 40 and 42 are then formed in the trenches 30 and 32 and separated from the sides thereof by the oxide layers 36 and 38, respectively.

Further, the etching used to form the trenches, is described in part in U.S. Pat. No. 4,690,729, issued Sept. 1, 1987 to Monte A. Douglas entitled "Tapered Trench Process," which patent application is incorporated herein by reference. The conductive plug 40 forms the gate of the transistor stack and the conductor plug 42 comprises the output of the transistor stack 34.

Referring to FIG. 3, after formation of the plugs 40 and 42, a layer of interlevel oxide 45 is deposited on the substrate and vias 46 and 48 are formed therethrough to expose the upper surfaces of the conductive plugs 40 and 42. In the preferred embodiment, the plugs 40 and 42 can be formed from a refractory metal, in which a refractory metal is sputtered on by a chemical vapor deposition process and then anisotropically etched to the level of the P. layer 28. The refractory metal can comprise titanium or tungston.

After formation of the vias 46 and 48, a metal layer is then deposited over the substrate to contact the upper surfaces of the plugs 40 and 42 through vias 46 and 48, respectively. The metal layer can comprise such metals as aluminum, deposited by techniques such as chemical vapor deposition. The metal layers are patterned and etched to define a conductor 50 which contacts the plug 42 through via 46 and a conductor 52 which contacts plug 40 through via 48 to form a first level interconnect pattern.

After formation of the first level of metal interconnects, a second layer of interlevel oxide 54 is deposited on the substrate and a via 56 formed therethrough to expose the upper portion of the P. layer 28 in the transistor stack 34. Thereafter, a second level of metal is deposited on the substrate to contact the transistor stack 34 at the P+ layer 28. The metal layer is deposited and patterned similar to the first metal layer which was utilized to form the conductors 50 and 52. The result is a conductor 58 on the second level. This conductor comprises the upper terminal of the CMOS inverter whereas the conductor 50 comprises the output of the CMOS inverter and the conductor 52 comprises the input.

After formation of the second level of interconnect 58, a protective layer of oxide 60 is deposited on the substrate to complete the processing of the active area and upper layer of metal interconnects. Thereafter, as shown in FIG. 4, a "holding" layer of polysilicon is deposited on the substrate in accordance with the teachings of U.S. patent application Ser. No. 053,440, filed May 22, 1987. The holding layer is illustrated in more detail in connection with FIG. 7. This process allows the upper surface of the substrate or structure of FIG. 3 to be supported while the bottom layer of the structure, referred to by reference numeral 10 is etched away up to the etch stop layer 12. The structure may be flipped to facilitate processing of the bottom surface. Thereafter, a layer of oxide 62 is deposited over the bottom layer of the substrate. This forms an interlevel of oxide similar to the interlevel oxide layers 45 and 54 of FIG. 3. The steps of etching the silicon substrate 10 and exposing the etch stop layer 12 will be described with respect to FIGS. 7-9.

Referring now to FIG. 5, a via 64 is formed through the oxide 62, the etch stop layer 12 and the P— layer 14 to expose the lower surface of the plug 42 that was formed in trench 32. In addition, a via 66 is formed through the oxide layer 62, P+ layer 12 and P— layer 14 to expose the surface of the N+ layer 18 in the transistor stack 34. The vias 64 and 66 can be fabricated by the above described processes using a plasma etch.

The location of the vias is determined by a photolithographic mask. The etch stop layer 12 is made thin, about 1000 Angstroms, such that it can be seen through using an infrared imaging system. The oxide layer 62 is transparent. Thus, the photolithographic mask can be aligned with the previously formed interconnect layers, or the alignment marks formed on the topside of device.

After formation of the vias 64 and 66, a conformal layer of silicon dioxide is formed over the substrate. The silicon dioxide provides a conformal layer that coats the exposed surface of the oxide layer 62 and the sidewalls of the vias 64 and 66. Thereafter, an anisotropic etch is used to remove the silicon dioxide from the opposed surface of the oxide 62 and the bottom surface of the vias 64 and 66, in order to expose the bottom surface of the plug 42 and the bottom surface of the N+ layer 18 in the transistor stack 34. The anisotropic etch etches in only a single direction upward to the bottom of the structure. The result is the formation of a sidewall oxide 68 on the sidewalls of via 64 and sidewall oxide 70 on the sidewalls of the via 66. The sidewall oxide 68 and 70 serve to insulate the interior of the vias 64 and 66 from the P— layer 14 and the P+ layer 12.

After formation of the sidewall oxide 68 and 70, metal is deposited by such techniques as chemical vapor deposition (CVD) to form a plug 72 in via 64 and a plug 74 in via 66.

After formation of the plugs 72 and 74, a layer of metal is deposited on the exposed surface of the oxide layer 62 and then patterned to form a conductor 76 which interconnects with the plug 72 to provide a contact on this level to the plug 42, which plug comprises the output of the transistor structure.

Referring to FIG. 6, a second level of interlevel oxide 78 is deposited over the exposed portion of the oxide layer 62 and a via 80 is formed through the oxide 78 to contact the plug 74 at the upper surface of the oxide layer 62. It should be understood that the purpose for forming the plug 74 at the same time as the formation of the plug 72 was to take advantage of the sidewall oxide 70 formed on the sidewalls of the via 66. After formation of via 80, a conductive plug 82 is formed in the via 80 which contacts the conductive plug 74. Conductive plug 82 is formed by a similar technique utilized to form conductive plugs 72 and 74. A second level metal is then deposited on the upper surface of the interlevel oxide 78 and then patterned to form a conductor 86. The conductor 86 comprises the lower terminal of the CMOS inverter. A protective oxide layer 88 is formed over the conductor 86.

Referring now to FIG. 7, there is illustrated a simplified drawing of the structure of FIG. 1, wherein like numerals refer to like parts in the various figures. For simplicity purposes, the structure overlying the P+ layer 12, represented in FIG. 1 by layers 14≧28, is represented by a single structure 90 with only one of the trenches 32 and associated plug 42 formed therein. The structure overlying the P+ layer 28 of FIG. 3 comprising the two levels of interconnects 52 and 58 and the interlevel oxide layers 44 and 54 is represented by single structure 92 with the protective oxide layer 60 overlying the structure 92. Thereafter, a layer of polycrystalline silicon 94 is deposited on the upper surface of the oxide layer 60 to a thickness of approximately 15 mils. This provides a surface which will allow the upper surface of the active circuit to be bonded to another silicon wafer, such that the lower surface thereof can be worked on. This is described in U.S. patent application Ser. No. 053,440, filed May 22, 1987, which disclosure is incorporated herein by reference.

Thereafter, the bottom surface 10 is etched up to the etch stop layer 12 to expose the etch stop layer 12 as illustrated in FIG. 8. The etch stop may be removed, for example, by oxidizing the etch stop layer and removing the doped etch stop layer with a doping selective etch, such as ethyline diamine, which is selective to P+. Alternatively, the etch stop layer 12 may be used as a grounded plane to prevent crosstalk between interconnect levels. Thereafter, as illustrated in FIG. 9, the interlevel oxide layer 62 is deposited, as was described with reference to FIG. 5, and the via 64 formed through the etch stop layer 12 to contact the trench 32 and expose the lower portion of the plug 42. The plug 72 is then formed in the trench 64 and a conductor 76 is formed on the exposed surface of the oxide layer 62.

FIG. 10 is illustrates the present invention used in conjunction with a standard diffused region CMOS process. The MOS transistors 96 comprise diffused regions 98 formed in a semiconductor layer 100 disposed above an etch stop layer 102 as previously described. An oxide layer 104 separates the gates 106 from the semiconductor layer 100.

As previously described, the upper interconnect level is created by forming a first oxide layer 108 having vias 110 with sidewall oxides 112. Conductive plugs 114 are formed therein, and a first interconnect level 116 contacts the appropriate plugs 114. A second layer of oxide 118 is formed over the first interconnect level 116, and second level vias 20 having sidewall oxides 122 and conductive plugs 124 are formed therein. A second interconnect level 126 contacts the plugs 124. A protective oxide layer 128 covers the second interconnect level 126. The holding layer 130 is formed over the protective oxide 128 to allow formation of the bottom interconnect structure. The substrate (not shown) is etched up to the etch stop layer 102, and the etch layer is removed, if desired.

The bottom interconnect structure is similarly formed, using a first oxide layer 132 through which first level vias 134 are formed. After performing an oxidation to form the sidewall oxide layer 135, and removing any oxide contacting the active device elements, conductive plugs 136 are formed in the vias 134 to contact the active device elements. A first interconnect level 137 contacts the plugs 136. A second level oxide layer 138 and second level vias 140 with sidewall oxide 142 and plugs 144 is similarly formed with a interconnect layer 146 formed thereon. A protective oxide 148 covers the interconnect layer 146.

The present invention illustrates a method whereby a layer of interconnect and associated integrated circuit with bulk active elements is formed on the surface of the silicon substrate with an etch stop layer underlying the active elements. This etch stop layer can have a thickness of approximately 1,000 angstroms and it is buried approximately 2,000–3,000 angstroms below the surface. After the upper interconnect levels of metallization are formed, the whole upper surface of the structure is encapsulated in a planarizing layer, which layer is then bonded to a mechanical support device. The planarizing layer is represented by a polysilicon layer 94 and 130 with the mechanical support structure illustrated in U.S. patent application Ser. No. 053,440.

One of the problems of making the backside context has been the question of alignment. In the present invention, the etch stop layer 12 is sufficiently thin enough and shallow enough that it is possible to see through the silicon at infrared wavelengths. Thus, the alignment procedure is to remove the silicon layer 10 to the etch stop layer 12 and then utilize infrared techniques to align the various masking layers by referencing the metal layers and/or alignment marks previously deposited on the front side of the wafer. These alignment marks are conventionally utilized on a single layer to provide alignment between various layers. In the present invention, the alignment marks on the front are utilized with the use of infrared techniques to align the various metal layers and patterns on the back surface. This can only be achieved with the presence of a relatively thin substrate, which substrate is achieved with the etch stop layer 12.

The small thickness of the etch stop layer 12 also enables accurate time etches to make backside contact within a reasonable tolerance with respect to process variations. For example, if a source/drain diffusions illustrated in FIG. 10 were formed on the upper surface of the substrate to a depth of approximately 1,500 angstroms and the total silicon crystalline thickness after backside etch back (and oxidation/strip if the etch layer is removed) were 3,000 angstroms, then a time etch of 2,000 angstroms to make backside contact would result in a plus or minus 20% accuracy and still be sufficiently precise for conventional processes.

Additionally, it is also possible to provide a surface cladding on the moat areas on the front side of the original wafer when fabricating conventional MOS transistors, providing an etch stop for backside etches. For example, silicides or self-aligned tungsten could be utilized to permit good electrical contact characteristics without having to do a timed etch for the backside contact etch.

In summary, there has been provided a process for forming backside contacts to a silicon substrate. A layer of heavily doped material is buried beneath the surface of a silicon substrate in which integrated circuit active elements are to be formed. The active elements are first formed in the substrate and then multiple layers of interconnect are formed by conventional techniques. Thereafter, a planarizing layer is formed on the upper surface of the substrate and the surface attached to a mechanical support. The backside of the substrate is etched to the etch stop layer to provide a relatively thin structure between the metal layers on the upper surface, such that the metal layers on the upper surface can be seen from the back side of the substrate. Vias are then formed through the etch stop layer and the silicon from the backside to expose the various conductive structures of the active elements in the integrated circuit. Metal layers are then formed with associated interlevel oxide layers on the backside to provide a backside contact pattern. This contact pattern is aligned with the use of the alignment marks on the front side.

The present invention provides the advantage that four or more levels of wiring can be implemented, which is particularly useful for semicustom logic, gate arrays, and other ASICs, as well as for random logic, such as microprocessors, and other complex parts such as custom SRAMs. Even where the improved connectivity provided by the additional layer of wiring is not required for optimization of the part, it can greatly simplify the design task. The infrared imaging allows for precise alignment of the masks defining the lower interconnect levels.

Although the present invention has been described with respect to a specific preferred embodiment thereof, various changes and modifications may be suggested to one skilled in the art and it is intended that the present invention encompass such changes and modifications as fall within the scope of the appended claims.

What is claimed is:

1. A method for forming an integrated circuit having interconnects on first and second sides of a semiconductor layer, comprising the steps of:
   forming an etch stop layer between the semiconductor layer and a substrate;
   forming active circuit elements on the first side of semiconductor layer;
   forming an upper interconnect layer in accordance with a predetermined conductive pattern to conductively interface said active circuit elements from the first side;
   removing portions of said substrate up to the etch stop layer;
   forming vias through the second side of semiconductor layer to expose selected areas of the active elements;
   forming a layer of insulating material on the vertical surfaces of said vias;

forming a conductive plug in said vias to contact the exposed surfaces of said active elements; and forming a bottom interconnect layer in accordance with a predetermined conductive pattern to conductively interface said conductive plugs from the second side.

2. The method of claim 1 wherein the step of forming said first side interconnect layer comprises:

forming a layer of insulating material over the surface of said active circuit elements;

forming contact holes through said insulating layer to selected areas of said active circuit elements;

forming a layer of metal over said insulating layer to contact the exposed portion of the active elements from the first side; and etching said conductive layer in accordance with said predetermined upper conductive pattern to form the first side interconnecting layer.

3. The method of claim 1 and further comprising the step of aligning masks defining the interconnect structure on said second side using an infrared imaging device.

4. The method of claim 1 and further comprising the step of supporting the first side of the integrated circuit prior to forming the second side interconnect layer.

5. The method of claim 4 wherein the step of supporting the first side comprises the steps of disposing a planarizing layer over the surface of the interconnect layer and mechanically supporting the integrated circuit with the planarizing layer.

6. The method of claim 1 wherein the step of forming the etch stop layer beneath the upper surface of the substrate comprises the step of forming a highly conductive layer on the substrate.

7. The method of claim 1 and further comprising the step of removing the etch stop layer using a doping selective etch.

8. The method of claim 7 wherein said step of removing the etch stop layer comprises oxidizing the etch stop layer and stripping the oxidized etch stop layer.

9. The method of claim 1 wherein the step of forming the vias through the semiconductor surface comprises the steps of:

aligning a pattern with the active circuits and conductive layer on the first side using infrared imaging; and etching the vias from the bottom of the substrate to a predetermined depth such that select areas on the active element are exposed.

10. A method for forming an integrated circuit having interconnects above and below active devices therein comprising the steps of;

forming an etch stop layer on the surface of a substrate;

forming a layer of epitaxially grown semiconductor material on the substrate over the etch stop layer to a predetermined thickness;

forming active circuit elements on the epitaxy layer;

forming a first layer of interlevel oxide overlying said epitaxy layer;

forming contact holes through the interlevel oxide layer on the upper surface to expose selected areas of the underlying active circuit elements;

forming a first conductive layer on the upper surface of the interlevel oxide in a predetermined pattern to define a first metal layer that contacts the exposed upper surface of the active elements through the contact holes;

mechanically supporting the integrated circuit to expose the bottom surface of the substrate;

etching the bottom of the substrate up to said etch stop layer;

forming a second layer of interlevel oxide below said etch stop layer;

forming contact holes through said second layer of interlevel oxide layer through the etch stop layer to contact the active circuit elements from the bottom side thereof to expose selected areas thereon;

forming a layer of insulating material on the vertical walls of the contact holes of the second layer to provide insulation from the epitaxy layer and the etch stop layer;

forming conductive plugs in the contact holes through said second interlevel oxide layer; and forming a second layer of conductive material in a predetermined pattern on the surface of the second layer of interlevel oxide to interconnect with the conductive plugs.

11. The method of claim 10 and further comprising:

forming a third layer of interlevel oxide over the first metal layer;

forming contact holes through the third layer of interlevel oxide and the second layer of interlevel oxide to expose selected areas on the surface of the active elements; and forming a third conductive layer on the upper surface of the interlevel oxide in accordance with a predetermined interconnect pattern to conductively interface with the exposed surfaces through said contact holes in said third layer.

12. The method of claim 10 wherein the step of mechanically supporting the upper surface of the substrate comprises forming a planarized layer of material and bonding a planarized layer to a mechanical support.

13. The method of claim 10 wherein the step of forming the contact holes through the second layer comprises aligning a contact hole pattern with a pattern on the front side of the integrated circuit by viewing the frontside pattern through the integrated circuit; and forming contact holes through the second layer of interlevel oxide in accordance with the backside contact hole pattern.

14. The method of claim 11 wherein the step of forming the layer of insulating material on the vertical walls of the contact holes comprises:

forming a conformal layer of oxide over the lower surface of the integrated circuit; and anisotropically etching the lower surface to remove the portions of the conformal insulating layer not on vertical surfaces of the contact holes.

15. The method of claim 10 wherein the step of forming the layer of expitaxially grown semiconductor material comprises forming a plurality of layers of epitaxially grown semiconductor materials of alternating conductivity types.

16. The method of claim 15 wherein the step of forming the active elements comprises;

forming a trench in the epitaxy material to a predetermined depth;

forming an insulating layer on the walls of the trench;

forming a conductive plug on the walls of the trench;

forming a conductive plug in the trench to comprise the gate electrode of an MOS transistor with the insulating layer comprising the gate insulator;

the step of forming the via on the upper surface of the substrate contacting the uppermost epitaxially grown layer;

the step of forming a via from the bottom surface of the substrate contacting the one of the epitaxial layers that is separated from the uppermost of the epitaxial layers by one layer of the opposite conductivity type such that a vertical MOS transistor is formed;

the step of forming the vias on the bottom surface also exposing the bottom surface of the conductive plug in the trench to provide a gate contact on the bottom surface.

* * * * *